United States Patent
Lius et al.

(10) Patent No.: US 12,387,647 B2
(45) Date of Patent: Aug. 12, 2025

(54) DISPLAY DEVICE

(71) Applicant: InnoLux Corporation, Miao-Li County (TW)

(72) Inventors: Chandra Lius, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 18/522,177

(22) Filed: Nov. 28, 2023

(65) Prior Publication Data

US 2024/0096255 A1 Mar. 21, 2024

Related U.S. Application Data

(63) Continuation of application No. 17/742,362, filed on May 11, 2022, now abandoned, which is a (Continued)

(51) Int. Cl.
*G09G 3/20* (2006.01)
*G06F 3/041* (2006.01)
(Continued)

(52) U.S. Cl.
CPC ............. *G09G 3/20* (2013.01); *G06F 3/0412* (2013.01); *G06V 40/13* (2022.01); *G09G 3/2074* (2013.01); *G09G 3/3208* (2013.01); *G09G 3/36* (2013.01); *G09G 3/3607* (2013.01); *G09G 3/3618* (2013.01); *G09G 3/364* (2013.01); *H10K 59/00* (2023.02); *G02F 1/1333* (2013.01); *G09G 2300/0809* (2013.01); *G09G 2310/04* (2013.01);
(Continued)

(58) Field of Classification Search
CPC .......... G09G 3/20; G09G 3/2074; G09G 3/36; G09G 3/3208; G09G 3/3607; G09G 3/3618; G09G 3/364; G09G 2310/04; G09G 2310/08; G09G 2340/0435; G09G 2300/0809; G09G 2360/148; G06K 9/00006; G06K 9/00013; G06F 2203/0338; G06F 3/0412; G06V 40/13; G02F 1/1333; H10K 59/00
USPC ................................... 345/214, 173
See application file for complete search history.

(56) References Cited

U.S. PATENT DOCUMENTS 10,579,848 B2 * 3/2020 Kim .................. G09G 3/3275
10,726,238 B2 * 7/2020 Gao ..................... G09G 3/20
(Continued)

FOREIGN PATENT DOCUMENTS

| CN | 109583420 A | 4/2019 |
|---|---|---|
| KR | 10-2018-0112186 A | 10/2018 |
| KR | 10-2019-0020958 A | 3/2019 |

*Primary Examiner* — Jason M Mandeville
(74) *Attorney, Agent, or Firm* — Winston Hsu (57) ABSTRACT

Disclosed is a display device including a controlling unit, a display driver electrically connected to the controlling unit, a sensor driver electrically connected to the controlling unit, a display element electrically connected to the display driver, and a sensor element electrically connected to the sensor driver. The display element comprises a first group of sub-pixels having a same color. The sensor element is sensing a biometric feature in a sensing time period, and the sensing time period comprises 3 to 120 frame times. All the first group of sub-pixels are turned on one time in each of the 3 to 120 frame times by the display driver.

6 Claims, 9 Drawing Sheets

Related U.S. Application Data continuation of application No. 16/416,263, filed on May 19, 2019, now abandoned.

(51) Int. Cl.
*G06V 40/13* (2022.01)
*G09G 3/3208* (2016.01)
*G09G 3/36* (2006.01)
*H10K 59/00* (2023.01)
*G02F 1/1333* (2006.01)

(52) U.S. Cl.
CPC . *G09G 2310/08* (2013.01); *G09G 2340/0435* (2013.01); *G09G 2360/148* (2013.01)

(56) References Cited

U.S. PATENT DOCUMENTS

| | | |
|---|---|---|
| 2009/0302331 A1 | 12/2009 | Smith |
| 2013/0207125 A1 | 8/2013 | Yamazaki |
| 2016/0092717 A1* | 3/2016 | Ling .................. G06V 40/1318 345/173 |
| 2018/0089491 A1* | 3/2018 | Kim ...................... G06V 40/67 |
| 2018/0151122 A1 | 5/2018 | Ding |
| 2018/0285619 A1 | 10/2018 | Kim |
| 2019/0065717 A1 | 2/2019 | Won |
| 2019/0370523 A1* | 12/2019 | Gao .................. G06V 40/1318 |
| 2020/0133414 A1* | 4/2020 | Lee ........................ G06F 3/044 |
| 2021/0216739 A1* | 7/2021 | Li ...................... G06V 40/1306 |

* cited by examiner

DISPLAY DEVICE

CROSS REFERENCE TO RELATED APPLICATIONS

This application is a continuation application of U.S. application Ser. No. 17/742,362, filed on May 11, 2022, which is a continuation application of U.S. application Ser. No. 16/416,263, filed on May 19, 2019. The contents of these applications are incorporated herein by reference.

BACKGROUND OF THE DISCLOSURE

1. Field of the Disclosure

The present disclosure relates to a display device, and more particularly, to a display device having biometric sensors.

2. Description of the Prior Art

The growing demand for information security and information privacy has driven use of biometric authentication on electronic devices such as smartphones, laptops, tablets, banking devices, and gaming consoles. A popular form of biometric authentication is fingerprint identification. Recently, fingerprint sensors have been adopted by various electronic devices so that the electronic devices can be unlocked by device owners via fingerprint authentication, protecting the electronic devices from unauthorized access.

Conventionally, just for an example, a fingerprint sensor is provided separately from a display panel in a display device, so a screen-locked display device can be unlocked by simply touching the fingerprint sensor. Nevertheless, it is of great interest to display device manufacturers and users to combine the fingerprint sensor into the display panel, thereby increasing the screen-to-body ratio of the display device and offering a narrow-border or bezel-less design. However, it is difficult to add the fingerprint sensor into the display region without losing the resolution of the display device, and when the fingerprint sensor is disposed in the display region, the area of the fingerprint sensor will be too small, resulting in bad sensitivity.

SUMMARY OF THE DISCLOSURE

According to an embodiment, a display device is disclosed and includes a controlling unit, a display driver electrically connected to the controlling unit, a sensor driver electrically connected to the controlling unit, a display element electrically connected to the display driver, and a sensor element electrically connected to the sensor driver. The display element comprises a first group of sub-pixels having a same color. The sensor element is sensing a biometric feature in a sensing time period, and the sensing time period comprises 3 to 120 frame times. All the first group of sub-pixels are turned on one time in each of the 3 to 120 frame times by the display driver, the sensor element is capable of receiving light emitted from the display element 3 to 120 times in the sensing time period to form a plurality of readout signals, and the sensor driver accumulates a portion of the readout signals and then receives the portion of the readout signals from the sensor element more than one time in the sensing time period, a last time of the more than one time is in an ending portion of the sensing time period.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented.

In addition, in this specification, relative expressions may be used. For example, "lower", "bottom", "higher" or "top" are used to describe the position of one element relative to another.

Although terms such as first, second, third, etc., maybe used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element maybe a second constituent element in a claim.

As used herein, the term "connected to" or "coupled to" that is used to designate a connection or coupling of one element to another element includes both a case that an element is "directly connected or coupled to" another element and a case that an element is "electronically connected or coupled to" another element via still another element.

It should be noted that the technical features in different embodiments described in the following can be replaced, recombined, or mixed with one another to constitute another embodiment without departing from the spirit of the present disclosure.

Figure 1:
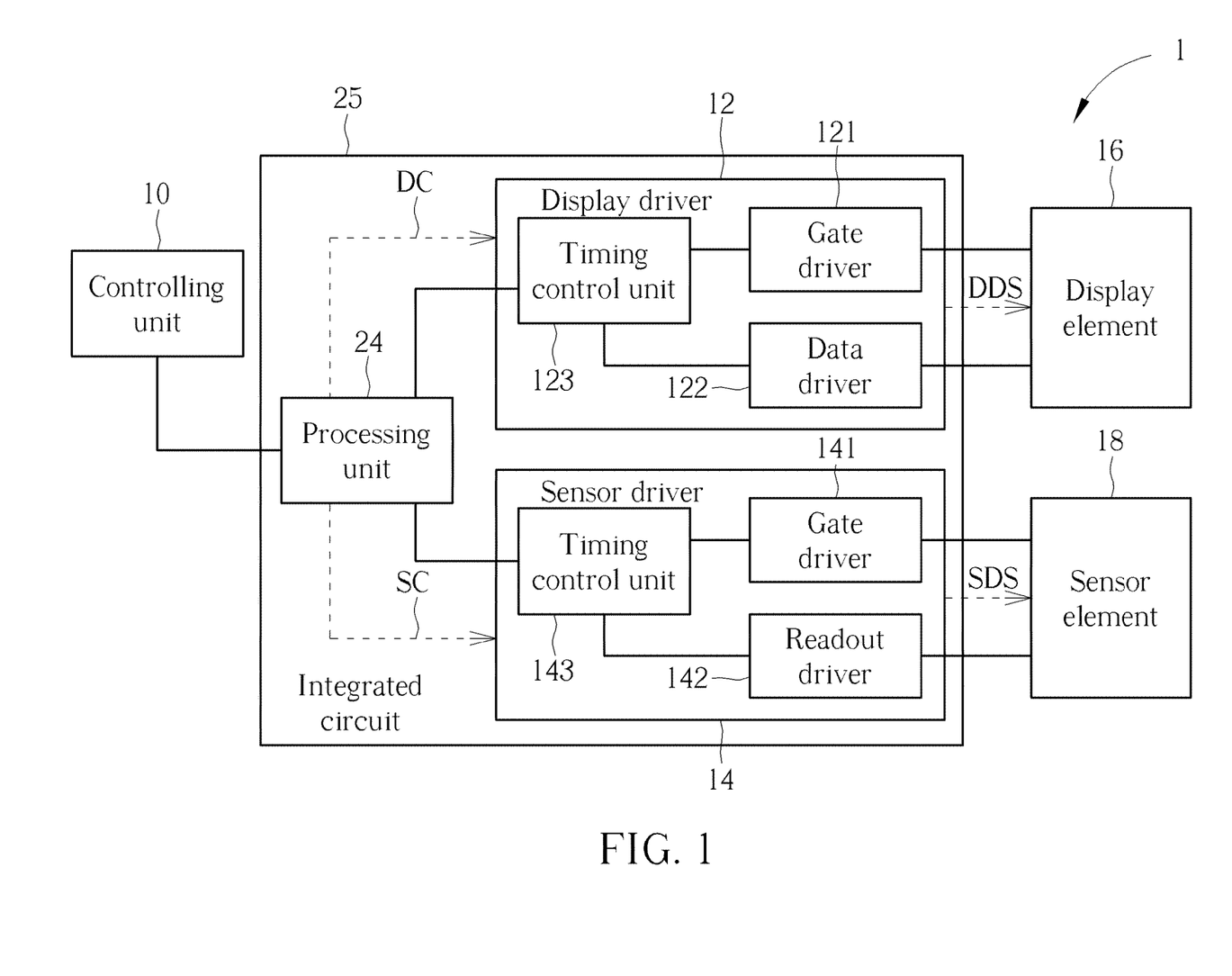
FIG. 1 schematically illustrates a block diagram of a display device according to an embodiment of the present disclosure.

FIG. 1 schematically illustrates a block diagram of a display device according to an embodiment of the present disclosure. The display device 1 can both display image and identify biometric feature in its display region. For example, the display device 1 may be a smart watch, a smartphone, a tablet or a display device having an in-display biometric sensor, but not limited thereto. In another embodiment, the display device 1 also could be used for tiling another display device to form a tiling electronic device. As shown in FIG. 1, the display device 1 of this embodiment includes a controlling unit 10, a display driver 12, a sensor driver 14, a display element 16, and a sensor element 18. The display driver 12 and the sensor driver 14 are electrically connected to the controlling unit 10 respectively, so the controlling unit 10 can respectively provide a display control signal DC to the display driver 12 and provide a sensor control signal SC to the sensor driver 14 for separately controlling on/off state of the display driver 12 and on/off state of the sensor driver 14. The controlling unit 10 may be for example an image processor, a digital signal processor, a central processing unit (CPU), a microprocessor or other suitable device. Furthermore, the display element 16 is electrically connected to and driven by the display driver 12, and the sensor element 18 is electrically connected to and driven by the sensor driver 14. After receiving the display control signal DC, the display driver 12 can transmit a display driving signal DDS to the display element 16 to turn on the display element 16; similarly, after receiving the sensor control signal SC, the sensor driver 14 can transmit a sensor driving signal SDS to the sensor element 18 to turn on the sensor element 18. The display element 16 is used for displaying image on screen or generating light for biometric feature identification; for example, the display element 16 may include sub-pixels of self-emissive display panel, such as an organic light-emitting diode (OLED) display panel, or an inorganic LED (such as quantum-dot LED, Mini-LED, or Micro-LED) display panel, or sub-pixels of non-self-emissive display panel, such as a liquid crystal display panel. The sensor element 18 is used for receiving reflected light from the biometric feature, so as to capture information (such as an image) of the biometric feature. The sensor element 18 maybe for example a fingerprint sensor or other kind of image sensor, but not limited thereto.

In this embodiment, the display device 1 may optionally further include a processing unit 24, and the controlling unit 10 is electrically connected to the display driver 12 and the sensor driver 14 through the processing unit 24. The function of the processing unit 24 may be the same as or similar to the function of the controlling unit 10, but not limited thereto. For example, the processing unit 24 can drive or operate the display driver 12 and drive the sensor driver 14, and then read signals from the sensor element 18 out. In such case, the controlling unit 10 may not only be used to drive the display driver 12, the sensor driver 14, the display element 16 and the sensor element 18, but also other devices. Thus, when the area of the display element 16 and the sensor element 18 is large, the data needed to process is huge, which may reduce the signal processing speed of the controlling unit 10. By means of the processing unit 24 designed to process signals in advance, the load of the controlling unit 10 can be shared with the processing unit 24. The signal processing speed of the display device 1 may be enhanced accordingly. In such situation, the display control signal DC and the sensor control signal SC may be provided from the processing unit 24. In some embodiment, the display driver 12, the sensor driver 14 and the processing unit 24 may be integrated into a single integrated circuit 25 that may be bonded on an array substrate of the display device 1, and the display element 16 and the sensor element 18 may be electrically connected to the single integrated circuit 25 through wires, but not limited thereto. In some embodiments, the display device 1 may not include the processing unit 24.

The display driver 12 may include a gate driver 121 and a data driver 122 for driving the display element 16. The gate driver 121 may provide scanning signals for turning on the display element 16, and the data driver 122 may provide display signals to the display element 16, such that the display element 16 can display the desired image. For example, the gate driver 121 may include shift register unit, logic unit, level shift unit and/or digital buffer unit, and the data driver 122 may include shift register unit, level shift unit, digital to analog converter (or multiplexer) and/or analog buffer unit, but not limited thereto. The sensor driver 14 may include another gate driver 141 and a readout driver 142 for signal readout of the sensor element 18. The gate driver 141 may provide scanning signals for turning on the sensor element 18, and the readout driver 142 may receive readout signals from the sensor element 18, such that the signals detected by the sensor element 18 can be read out. In some embodiments, the gate driver 121, the data driver 122, the gate driver 141 and/or the readout driver 142 may be formed in the array substrate of the display device 1 by thin-film transistor process, but not limited thereto. In some embodiments, the gate driver 121, data driver 122, the gate driver 141 and/or the readout driver 142 may be formed in one or more integrated circuit and be bonded on the array substrate or a flexible printed circuit substrate that adheres to the array substrate.

In this embodiment, the display driver 12 may optionally further include a timing control unit 123 electrically connected to the gate driver 121 and the data driver 122 to provide timing signals to the gate driver 121 and the data driver 122 respectively, and the gate driver 121 and the data driver 122 are electrically connected to the controlling unit 10 or the processing unit 24 through the timing control unit 123. In some embodiments, the timing control unit 123 may be disposed outside the display driver 12 but still be electrically connected between the gate driver 121 and the controlling unit 10 or the processing unit 24 and between the data driver 122 and the controlling unit 10 or the processing unit 24.

In this embodiment, the sensor driver 14 may optionally further include another timing control unit 143 electrically connected to the gate driver 141 and the readout driver 142 to provide timing signals to the gate driver 141 and the readout driver 142 respectively, and the gate driver 141 and the readout driver 142 are electrically connected to the controlling unit 10 or the processing unit 24 through the another timing control unit 143. In some embodiments, the another timing control unit 143 may be disposed outside the sensor driver 14 but still be electrically connected between the gate driver 141 and the controlling unit 10 or the processing unit 24 and between the readout driver 142 and the controlling unit 10 or the processing unit 24.

In some embodiments, the timing control unit 123 and the another timing control unit 143 may be integrated into one timing control unit outside the display driver 12 and the sensor driver 14, and the integrated timing control unit may electrically connect the display driver 12 and the sensor driver 14 to the controlling unit 10 or the processing unit 24 respectively, thereby reducing the number of the timing control units. Since the display driver 12 and the sensor driver 14 are controlled by the same one timing control unit, the possibility of timing disorder or timing error can be reduced. Also, when the processing unit 24, the integrated one timing control unit, the display driver 12 and the sensor driver 14 are integrated into one integrated circuit, the size of the integrated circuit can be decreased, and the border width of the display device 1 for disposing the integrated circuit can be narrowed. In some embodiments, the integrated one timing controlling unit and the processing unit 24 maybe integrated into a single integrated circuit while the display driver 12 and the sensor driver 14 are not integrated into the single integrated circuit.

In some embodiments, the display device 1 may further include a touch sensing element (not shown in figures) for sensing the position of the biometric feature. The touch sensing element may be electrically connected to the controlling unit 10 or the processing unit 24, such that when the touch sensing element senses the touching of the biometric feature on the display device 1, the controlling unit 10 or the processing unit 24 may define the touching region of the biometric feature as a biometric feature identifying region for further detecting the biometric feature.

Figure 2:
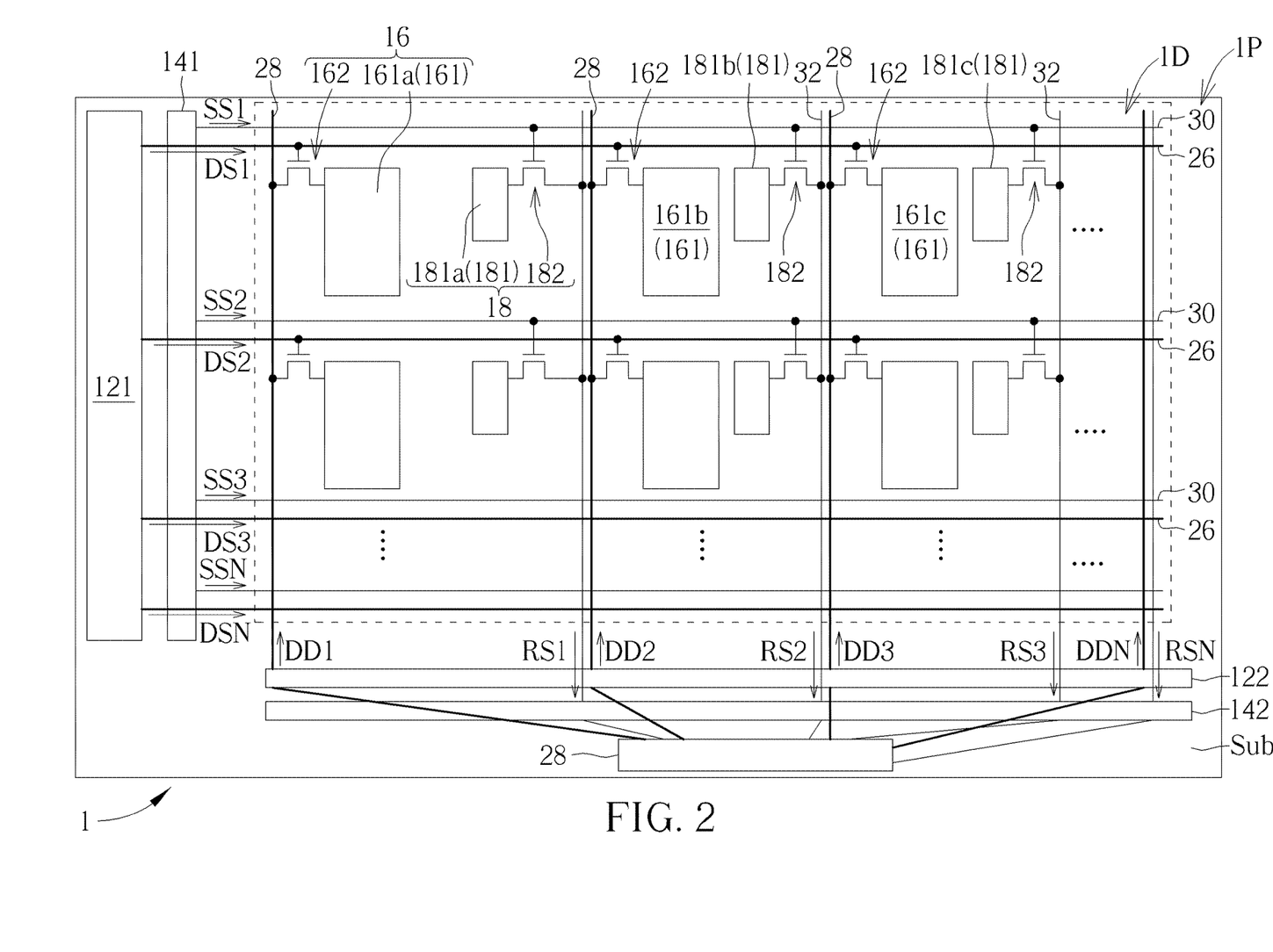
FIG. 2 schematically illustrates a top view of a display device according to this embodiment of the present disclosure.

FIG. 2 schematically illustrates a top view of a display device according to this embodiment of the present disclosure. The display device 1 has a display region 1D for displaying image and a peripheral region 1P that doesn't display image. The peripheral region 1P is disposed on at least one side of the display region 1D. For example, the peripheral region 1P surrounds the display region 1D. A width of the peripheral region 1P may be also referred to as the border width of the display decide 1. The display element 16 and the sensor element 18 are disposed in the display region 1D, and the display driver 12, the sensor driver 14 and the processing unit 24 shown in FIG. 1 are disposed in the peripheral region 1P. The regions and the numbers of the gate driver 121 and the data driver 122 of display driver 12 and the regions and numbers of the gate driver 141 and the readout driver 142 of the sensor driver 14 shown in FIG. 2 are for illustration and not limited thereto. In some embodiments, the number of the gate driver 121 and/or the number of the data driver 122 may be one or more. In some embodiments, the number of the gate driver 141 and/or the number of the readout driver 142 may be one or more.

Specifically, the display device 1 may further include a plurality of display scan lines 26, a plurality of display data lines 28, a plurality of sensor scan lines 30, and a plurality of sensor signal lines 32 formed on a substrate Sub. The display element 16 includes a plurality of sub-pixels 161 and a plurality of transistors 162 formed on the substrate Sub, in which each sub-pixel 161 is electrically connected to a corresponding transistor 162, and a gate and a source of each transistor 162 are electrically connected to the gate driver 121 and the data driver 122 respectively through a corresponding display scan line 26 and a corresponding display data line 28, such that the on/off state of each transistor 162 can be controlled by display scanning signals DS1-DSN from the gate driver 121, and the display of each sub-pixel 161 can be controlled by display data signals DD1-DDN from the data driver 122. In one embodiment, the display element 16 may include at least one transistor 162 corresponding to one of the sub-pixels 161, for example, if the display element 16 includes at least two transistors 162 corresponding to one of the sub-pixels 161, wherein the at least two transistors 162 could be of a same type or different types, but not limited thereto. In an example of the transistor of the display element 16 electrically connected to the corresponding sub-pixel 161, the number of the transistor corresponding to one of the sub-pixels may be 1, 3, 4 or 7. In another example of the display element 16 including plural transistors 162 corresponding to one sub-pixel 161, the plural transistors 162 may include a switch transistor and/or a driving transistor, but not limited thereto. In some embodiments, the transistor 162 "corresponding to" one of the sub-pixels as used herein represents the transistor 162 is electrically connected to the one of the sub-pixels 161.

Similarly, the sensor element 18 includes a plurality of sensing units 181 and a plurality of transistors 182 formed on the substrate Sub, in which each sensing unit 181 is electrically connected to a corresponding transistor 182, and a gate and a source of each transistor 182 are electrically connected to the gate driver 141 and the driver 142 respectively through a corresponding sensor scan line 30 and a corresponding sensor signal line 32, such that the on/off state of each transistor 182 can be controlled by sensor scanning signals SS1-SSN from the gate driver 141, and the readout driver 142 may receive readout signals RS1-RSN from each sensing unit 181. In addition, the sensor element 18 may include at least one transistor 182 corresponding to one of the sensing units 181. In another example of the transistor of the sensor element 18 electrically connected to the corresponding sensing unit 181, the number of the transistor may be 2 or 3. In another example of the sensor element 18 including plural transistors 182 corresponding to one sensing unit 181, the plural transistors 182 may include a readout transistor, a reset transistor and/or an amplifier transistor but not limited thereto. The transistor 182 "corresponding to" one of the sensing units 181 as used herein represents the transistor 182 is electrically connected to the one of the sensing units 181. In some embodiments, the transistor 162 and/or the transistor 182 may be a thin-film transistor. In some embodiments, type of the transistor 162 and/or the transistor 182 may be an amorphous thin-film transistor, a low-temperature polysilicon thin-film transistor, a metal-oxide thin-film transistor, but it is not limited thereto.

In this embodiment, each sensing unit 181 is used to detect light from the corresponding sub-pixel 161. For example, the sensing units 181 may include a plurality of sensing units 181a, a plurality of sensing units 181b, and a plurality of sensing units 181c, the sub-pixels 161 may include a plurality of first sub-pixel 161a for emitting light with a first color, a plurality of second sub-pixel 161b for emitting light with a second color, and a plurality of third sub-pixel 161c for emitting light with a third color, and each sensing unit 181a, each sensing unit 181b and each sensing unit 181c correspond to one first sub-pixel 161a, one second sub-pixel 161b and one third sub-pixel 161c respectively. In other words, each sensing unit 181a can detect the light having the first color, each sensing unit 181b can detect the light having the second color, and each sensing unit 181c can detect the light having the third color, in which the first color, the second color and the third color are different from one another, but not limited thereto. For example, the first color, the second color and the third color may be respectively red, green and blue, but not limited thereto. For example, the sensing unit 181 may include a corresponding color filter disposed thereon for allowing one color passing through and filtering light with different colors so as to avoid light interference. In some embodiments, each sensing unit 181 may for example be an optical (such as photo diode) detector, a capacitive detector, a radio frequency (RF) detector, a thermal, piezoresistive detector, an ultrasonic detector, or a piezoelectric detector, but not limited thereto.

Figure 3:
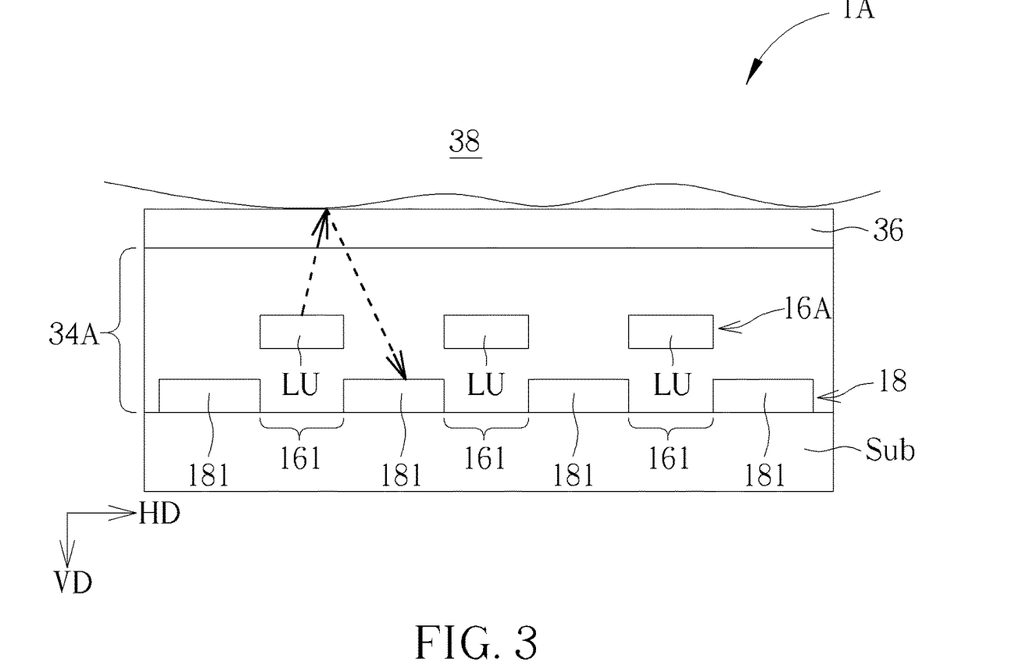
FIG. 3 and FIG. 4 schematically illustrate sectional views of display elements and sensor elements according to some embodiments of the present disclosure.
Figure 4:
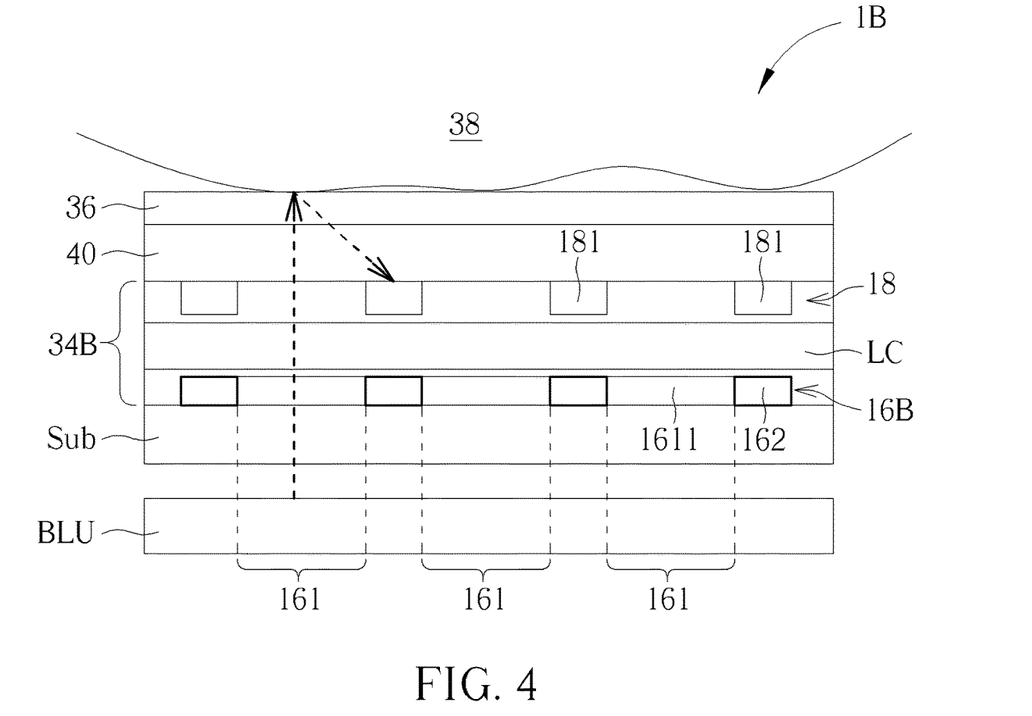

FIG. 3 and FIG. 4 schematically illustrate sectional views of display devices according to some embodiments of the present disclosure. In some embodiments shown in FIG. 3, the display device 1A may include self-emissive display panel, and each of the sub-pixels 161 of the display element 16A may include a light-emitting unit LU. Specifically, the display device 1A may include a display layer 34A formed on the substrate Sub and a cover substrate 36 covering and protecting the display layer 34A, in which the display layer 34A may include the light-emitting units LU of the display element 16A and the sensor element 18 including a plurality of sensing units 181, and the sensor element 18 may be formed under the light-emitting units LU, but not limited thereto. For example, the sensor element 18 is disposed between the light-emitting units LU and the substrate Sub, i.e. the light-emitting units LU and the sensor element 18 are formed in the same display layer 34A. In a vertical direction VD (top view), the sensing units 181 may be disposed in the gaps of the sub-pixels 161, such that the light from the sub-pixel 161 can be reflected to the corresponding sensing unit 181 by the biometric feature 38, as an arrow shown in FIG. 3. The vertical direction VD is defined as being substantially perpendicular to a horizontal direction HD. The horizontal direction HD represents the horizontal direction of the substrate Sub that is flattened horizontally. In some embodiments, the light-emitting unit LU may include organic light-emitting diode (OLED), quantum-dot LED (QLED), Mini-LED, Micro-LED or other type light-emitting device. In some embodiments, the sensing units 181 may be formed under the substrate Sub, so that the sub-pixels 161 and the sensing units 181 are formed on two sides of the substrate Sub (not shown in FIG. 3).

In some embodiments shown in FIG. 4, the display device 1B may include non-self-emissive display panel. For example, the non-self-emissive display panel is a liquid crystal display panel, and the display layer 34B of the display device 1B may include a liquid crystal layer LC, the display element 16B and the sensor element 18 between the substrate Sub and a counter substrate 40, in which the liquid crystal layer LC is disposed between the display element 16B and the sensor element 18. Specifically, the display element 16B is disposed between the liquid crystal layer LC and the substrate Sub, the sensor element 18 is disposed between the liquid crystal layer LC and a counter substrate 40, and the sensing unit 181 is disposed above the corresponding transistor (e.g. transistor 162) of the display element 16B. Also, the display device 1B may further include a backlight module BLU disposed under the substrate Sub and used for generating a suitable light (such as white light). The sub-pixel 161 of some embodiments may include a liquid crystal controller 1611 for controlling the rotation of the liquid crystal molecules corresponding to the region of the sub-pixel 161. For example, the liquid crystal controller 1611 may be a pixel electrode or other components, but not limited thereto. Thus, light from backlight module BLU can penetrate through the sub-pixel 161 and be reflected by the biometric feature to the corresponding sensing unit 181, as an arrow shown in FIG. 4. For example, the counter substrate 40 may include color filters (not shown) for allowing light having different colors to be emitted. In some embodiments, in order to generate light with uniform brightness, the color filters with different colors may have different thicknesses. In some embodiments, the display device 1B may optionally include the cover substrate 36 disposed on the counter substrate 40. In some embodiments, the sensor element 18 may be disposed between the counter substrate 40 and the cover substrate 36. In one embodiment, the cover substrate 36 can have a touch function, but not limited thereto.

Figure 5:
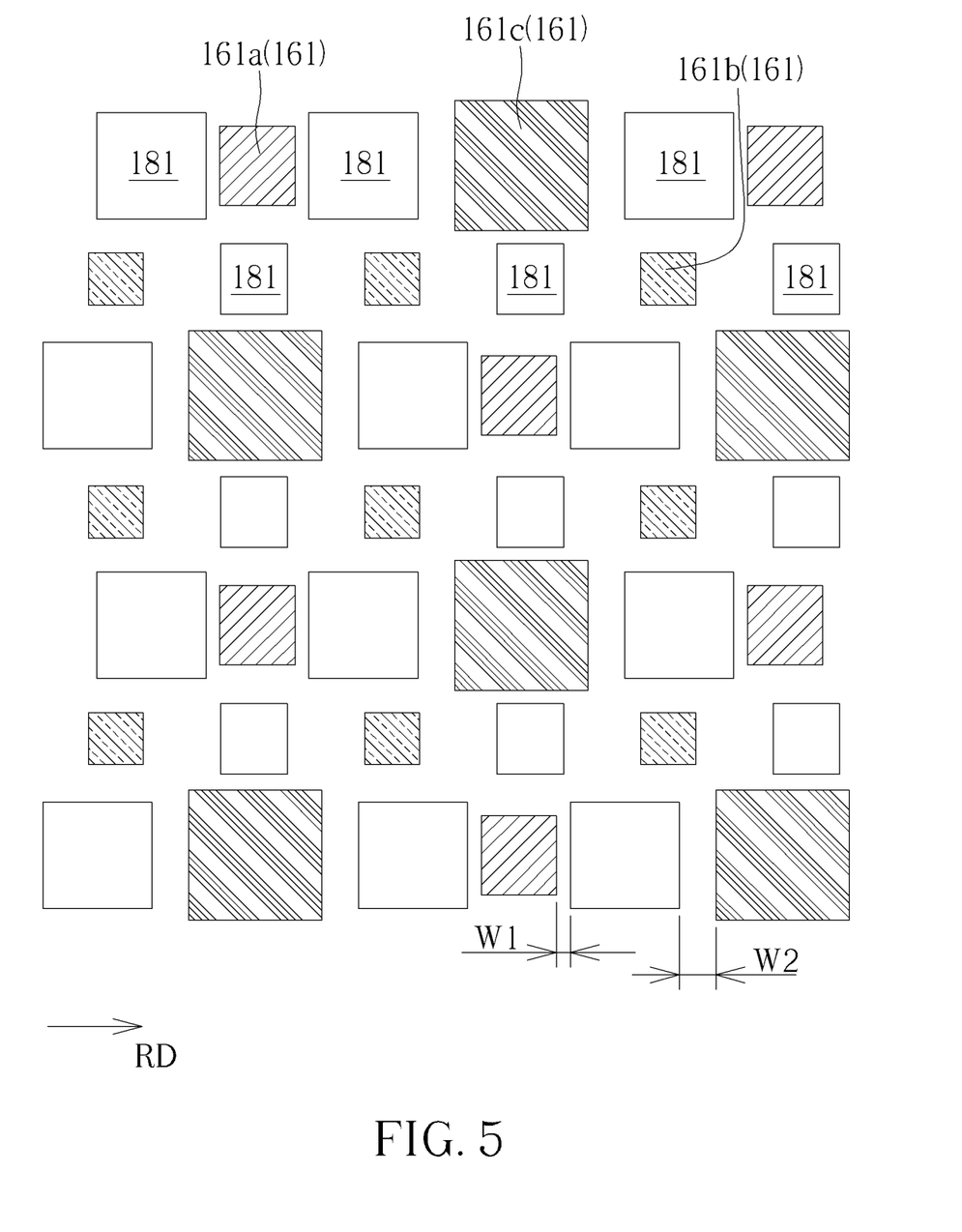
FIG. 5 schematically illustrates a top view of an arrangement of the sub-pixels and the sensing units according to some embodiments of the present disclosure.

FIG. 5 schematically illustrates a top view of an arrangement of the sub-pixels and the sensing units according to some embodiments of the present disclosure. In some embodiments, the arrangement of the sub-pixels 161 may be pentile matrix, and each sensing unit 181 is disposed between adjacent two of sub-pixels 161. For example, in an odd row, the first sub-pixels 161a having first color and the third sub-pixels 161c having third color are alternately arranged along the row direction, and the sensing units 181 and the sub-pixels 161 (such as 161a and 161c) in the odd row are alternately arranged along the row direction. In an even row, the second sub-pixels 161b having second color are arranged along the row direction, and the sub-pixels 161 (such as 161b) and the sensing units 181 in the even row are alternately arranged along the row direction. Also, in an odd column, the second sub-pixels 161b and the sensing units 181 are alternately arranged along the column direction; and in an even column, the first sub-pixels 161a and the third sub-pixels 161c are alternately arranged along the column direction, and the sub-pixels 161 (such as 161a and 161c) and the sensing units 181 in the odd column are alternately arranged along the column direction.

In some embodiments, the first sub-pixel 161a, the second sub-pixel 161b and the third sub-pixel 161c may have different areas in a top view of the display device 1. For example, since the first color, the second color and the third color are red, green and blue respectively, the area of the third sub-pixel 161c may be greater than the area of the first sub-pixel 161a, and the area of the first sub-pixel 161a may be greater than the area of the second sub-pixel 161b. In some embodiments, the sensing units 181 may have different areas in a top view of the display device 1 based on the area difference between the sub-pixels 161. For example, the sensing units 181 arranged in the same row as the first sub-pixels 161a and the third sub-pixels 161c (such as odd row) may have greater area or less area than the sensing units 181 arranged in the same row as the second sub-pixels 161b (such as even row). In some embodiments, one of the sensing units 181 between the adjacent first sub-pixel 161a and the adjacent third sub-pixel 161c may be closer to the adjacent first sub-pixel 161a having the first color than the adjacent third sub-pixel 161c having the third color. In other words, since third sub-pixel 161c emits blue light, which is scattered easier and worse than the red light, to improve the signal to noise ratio (S/N) of the sensor element 18, a distance W1 between the sensing unit 181 and the adjacent first sub-pixel 161a is less than a distance W2 between the sensing unit 181 and the adjacent third sub-pixel 161c. The distance W1 is the shortest distance between the sensing unit 181 and the first sub-pixel 161a adjacent to each other in a row direction RD, and the distance W2 is the shortest distance between the sensing unit 181 and the third sub-pixel 161c adjacent to each other in the row direction RD. In some embodiments, any two of the colors of the first sub-pixel 161a, the second sub-pixel 161b and the third sub-pixel 161c may be exchanged or may be other colors. In some embodiments, arrangement of the first sub-pixel 161a, the second sub-pixel 161b and the third sub-pixel 161c may be other kind of arrangement.

Figure 6:
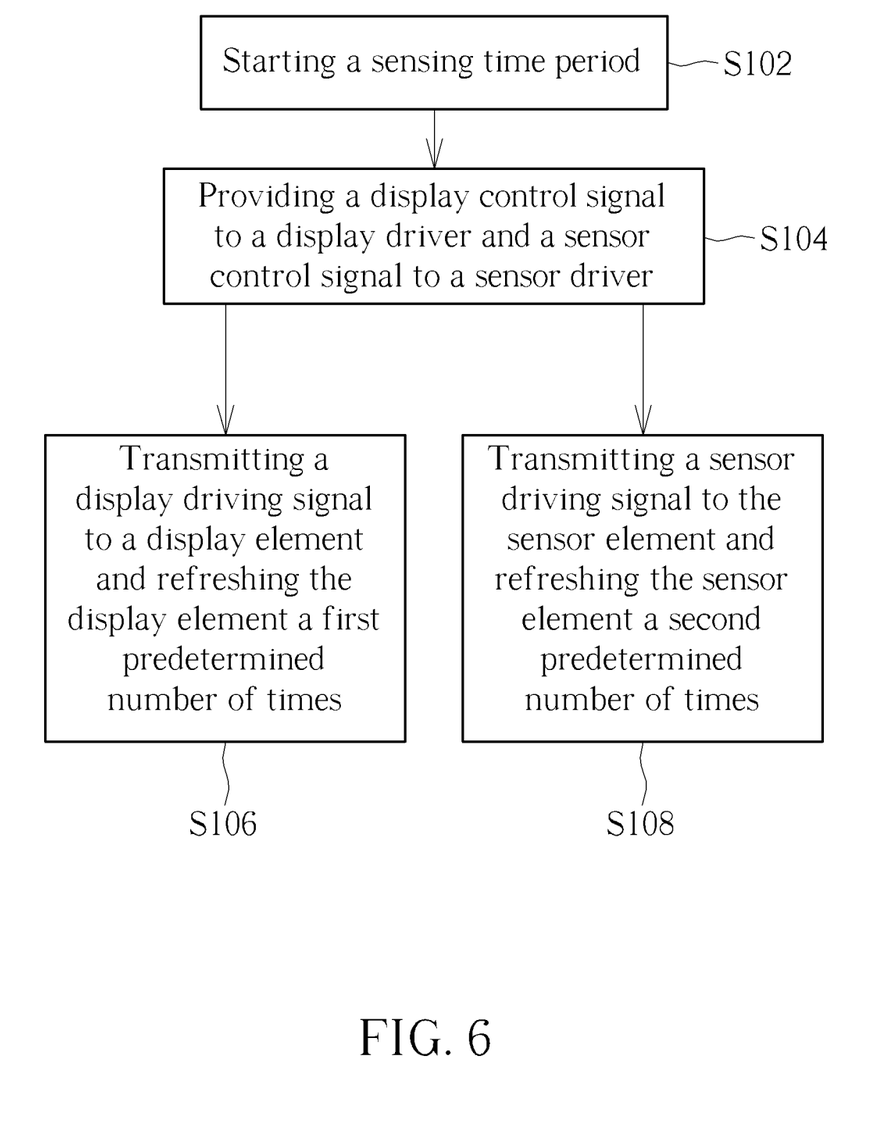
FIG. 6 schematically illustrates a flowchart of a driving method of the display device for identifying the biometric feature according to this embodiment of the present disclosure.
Figure 7:
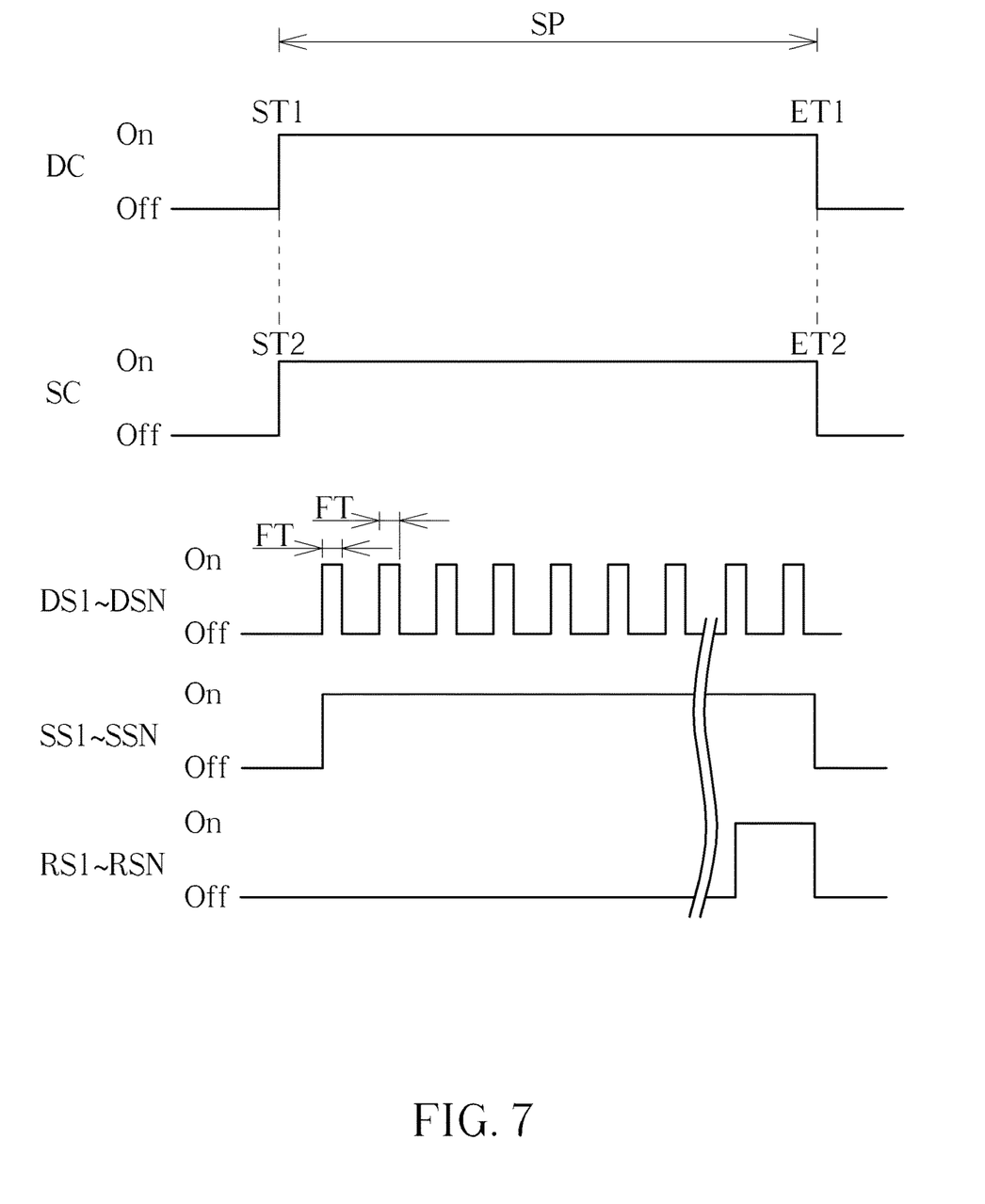
FIG. 7 schematically illustrates timing sequences of the display control signal, the sensor control signal, the display scanning signal, the sensor scanning signal and the readout signal.

The following description further details a driving method of the display device of the present disclosure. FIG. 6 schematically illustrates a flowchart of a driving method of the display device for identifying the biometric feature according to this embodiment of the present disclosure, and FIG. 7 schematically illustrates timing sequences of the display control signal, the sensor control signal, the display scanning signal, the sensor scanning signal and the readout signal. The driving method of the display device includes the following steps and is detailed accompanying with FIG. 7 as well as FIG. 1 and FIG. 2. In step S102, the display device 1 starts a sensing time period SP. In the sensing time period SP, the display device 1 starts to detect the biometric feature. For example, when the sensor element 18 detects the touching of the biometric feature on the display device 1, the controlling unit 10 or the processing unit 24 may start the sensing time period SP for detecting the biometric feature. The condition for starting the sensing time period SP of the present disclosure is not limited thereto.

In step S104, the display control signal DC and the sensor control signal SC (an enable signal) are respectively provided to the display driver 12 and the sensor driver 14 by the control unit 10 or the processing unit 24, such that the sensor driver 14 can be activated by the enable signal from the control unit 10 or the processing unit 24. The duration of the display control signal DC overlaps the duration of the sensor control signal SC, such that the display element 16 may generate light for biometric feature identification and the sensor element 18 can detect the reflected light from the biometric feature. For example, the display control signal DC and the sensor control signal SC may be simultaneously provided by the controlling unit 10 or the processing unit 24 and be ended at the same time, such that the display driver 12 and the sensor driver 14 can be synchronized by the controlling unit 10 or the processing unit 24. In some embodiments, the start time ST1 of the display control signal DC may be earlier than the start time ST2 of sensor control signal SC. As long as the biometric feature can be correctly identified, the start time ST1 and the end time ET1 of the display control signal DC and the start time ST2 and the end time ET2 of the sensor control signal SC can be altered.

In step S106, after the display driver 12 receives the display control signal DC, a display driving signal DDS is transmitted to a display element 16 by the display driver 12, and the display element 16 is refreshed a first predetermined number of times when the sensing element 18 is sensing the biometric feature in the sensing time period SP. In this embodiment, the first predetermined number of times may range from 3 to 120 in the sensing time period SP. In other words, the display driving signal DDS may be repeatedly transmitted to the display element 16 ranged from 3 to 120 times, such that the sub-pixels 161 may generate light pulse 3 to 120 times. It is noted that since the display element 16 can generate light pulse 3 to 120 times in the sensing time period SP, the sensor element 18 can receive light 3 to 120 times, thereby accumulating enough electric charges and improving the S/N ratio and the sensitivity of the sensing units. For this reason, the sensing units 181 can be disposed in the display region 1D without reducing the area of each sub-pixel 161 or reducing the resolution of the display device 1, i.e. the sensor element 18 can be integrated with the display element 16 into the display region 1D of the display device 1, thereby increasing screen-to-body ratio while providing biometric authentication. Also, even the area of the sensing unit 181 is small, through the increased refreshing times, the sensing units 181 still can have good sensitivity.

Specifically, the display driving signal DDS may include a plurality of display scanning signals DS1-DSN transmitted to the display scan line 26 respectively and a plurality of display data signals DD1-DDN transmitted to the display data lines 28 respectively. In one frame time FT of the sensing time period SP, the display scanning signals DS1-DSN may be sequentially transmitted one time, and the display data signals DD1-DDN may be transmitted according to the display scanning signals DS1-DSN, such that the sub-pixels 161 can emit the required light pulse one time while receiving the display data signals DD1-DDN. When the display element 16 is refreshed 3 to 120 times in the sensing time period SP, the display scanning signals DS1-DSN may be sequentially transmitted to the display element 16 ranged from 3 to 120 times in 3 to 120 frame times FT. In some embodiments, adjacent two of the display scanning signals DS1-DSN may overlap each other or not in one frame time FT. In some embodiment, the first predetermined number of times may be 6 to 72 times. In order to have short unlocking time, the first predetermined number of times may be decreased based on the frame time FT. For example, when the refreshing rate(frequency) of the display device 1 is 60 Hz (i.e. the frame time FT is 0.0167 seconds), the first predetermined number of times may be 6, 18 or 30. When the refreshing rate(frequency) of the display device 1 is 120 Hz (i.e. the frame time FT is 0.0083 seconds less than 0.0167 seconds), the first predetermined number of times may be increased to be 12, 36 or 60.

In step S108, after the sensor driver 14 receives the sensor control signal SC, a sensor driving signal SDS is transmitted to the sensor element 18 by the sensor driver 14, and the sensor element 18 is refreshed a second predetermined number of times in the sensing time period SP. In this embodiment, as shown in FIG. 7, the second predetermined number of times may be one. Specifically, the sensor driving signal SDS may include a plurality of sensor scanning signals SS1-SSN and a plurality of readout signals RS1-RSN. When the sensor element 18 is driven once, the duration of the sensor scanning signals SS1-SSN may overlap all the frame times FT of the display element 16. The readout signals RS1-RSN may be received by the readout driver 142 near the end time of the sensor scanning signals SS1-SSN. The duration of the readout signals RS1-RSN may overlap at least one frame time FT or not. In some embodiments, the second predetermined number of times may be plural, so the electric charges converted by the sensing units 181 can be read out plural times in one sensing time period SP by the readout driver 142, and the readout signals RS1-RSN received by the readout driver 142 more than one time in one sensing time period SP can be accumulated by the sensor driver 14 to increase the S/N ratio. In some embodiments, the sensor element 18 of the display device 1 may perform more than one time to detect the biometric feature in more than one sensing time period SP.

Figure 8:
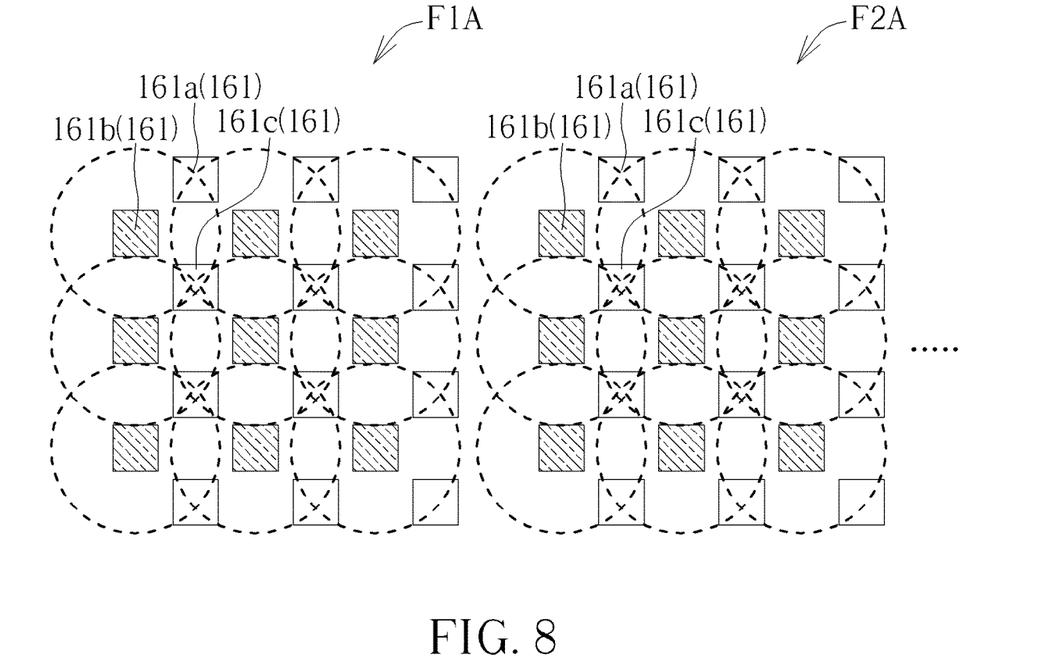
FIG. 8 schematically illustrates the sub-pixels turned on in different frame times according to some embodiments of the present disclosure.

FIG. 8 schematically illustrates the sub-pixels turned on in different frame times according to some embodiments of the present disclosure. For clarity, the arrangement of the sub-pixels mentioned in the following embodiments takes pentile matrix for an example, and sensing units are not shown, but not limited thereto. In some embodiments, all the sub-pixels 161 having the same color are turned on repeatedly, and the remaining sub-pixels having different colors are turned off in one sensing time period, so as to display one frame in each frame time. For example, all the second sub-pixels 161b having the second color are driven and turned on repeatedly to sequentially generate the frames (e.g. a first frame F1A, a second frame F2A, etc.) while the first sub-pixels 161a and the third sub-pixels 161c are turned off, so as to generate light having the same second color in each frame time. Thus, the sensing units 181 corresponding to the second sub-pixels 161b may detect the light having the second color without being interfered by other color light, thereby increasing the sensitivity of the sensing units 181. For example, a circle shown in FIG. 8 may represent a region of reflected light from each second sub-pixel 161b. In some embodiments, all the sub-pixels 161 turned on in each frame FA may also be all the first sub-pixels 161a or all the third sub-pixels 161c. In one embodiment, a region shape of a reflected light from one sub-pixel 161 may be a circle, a polygon or a free-shape, but not limited thereto. In some embodiments, an area of the region is not limited to the drawings in the figures and also could be adjusted to a suitable size, but not limited thereto.

Figure 9:
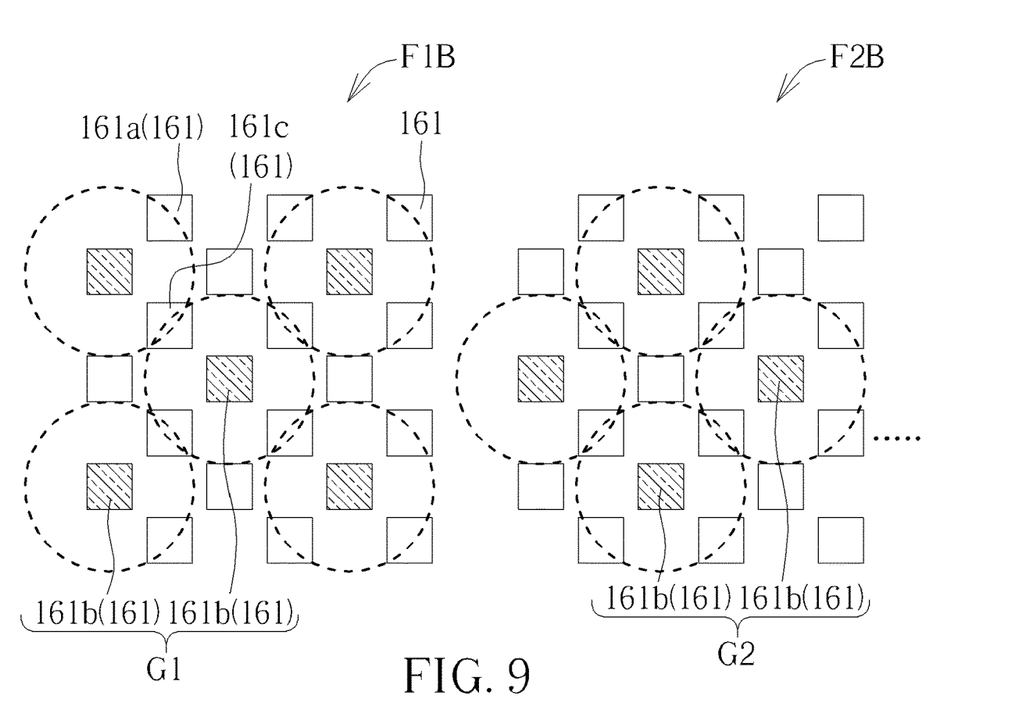
FIG. 9 schematically illustrates sub-pixels turned on in different frame times according to some embodiments of the present disclosure.

FIG. 9 schematically illustrates sub-pixels turned on in different frame times according to some embodiments of the present disclosure. In some embodiments, a first group G1 of the sub-pixels 161 and a second group G2 of the sub-pixels 161 are turned on sequentially and alternately, and the remaining sub-pixels 161 are turned off in the sensing time period SP, in which the sub-pixels 161 in first group G1 are different from the sub-pixels 161 in the second group G2. Specifically, the first group G1 of the sub-pixels 161 is turned on to display one frame F1B in one frame time, and then the second group G2 of the sub-pixels 161 is turned on to display another frame F2B in another frame time, in which the first group G1 of the sub-pixels 161 and the second group G2 of the sub-pixels 161 may have the same color. As an example, the second sub-pixels 161b may be the sub-pixels 161 turned on in the sensing time period. The second sub-pixels 161b in the first group G1 are not adjacent sub-pixels 161, so the distance between the adjacent second sub-pixels 161b in the first group G1 can be increased, thereby reducing the interference of reflected light from different second sub-pixels 161b, as the circles shown in FIG. 9. Similarly, the second sub-pixels 161b in the second group G2 may prevent the interference of different second sub-pixels 161b. For example, one of the second sub-pixels 161b in the first group G1 maybe disposed between adjacent two of the second sub-pixels 161b in the second group G2. In other words, the second sub-pixels 161b in the first group G1 and the second sub-pixels 161b in the second group G2 are respectively arranged in staggered pattern, and in each even row, each second sub-pixel 161b in the first group G1 and each second sub-pixel 161b in the second group G2 are alternately arranged.

Figure 10:
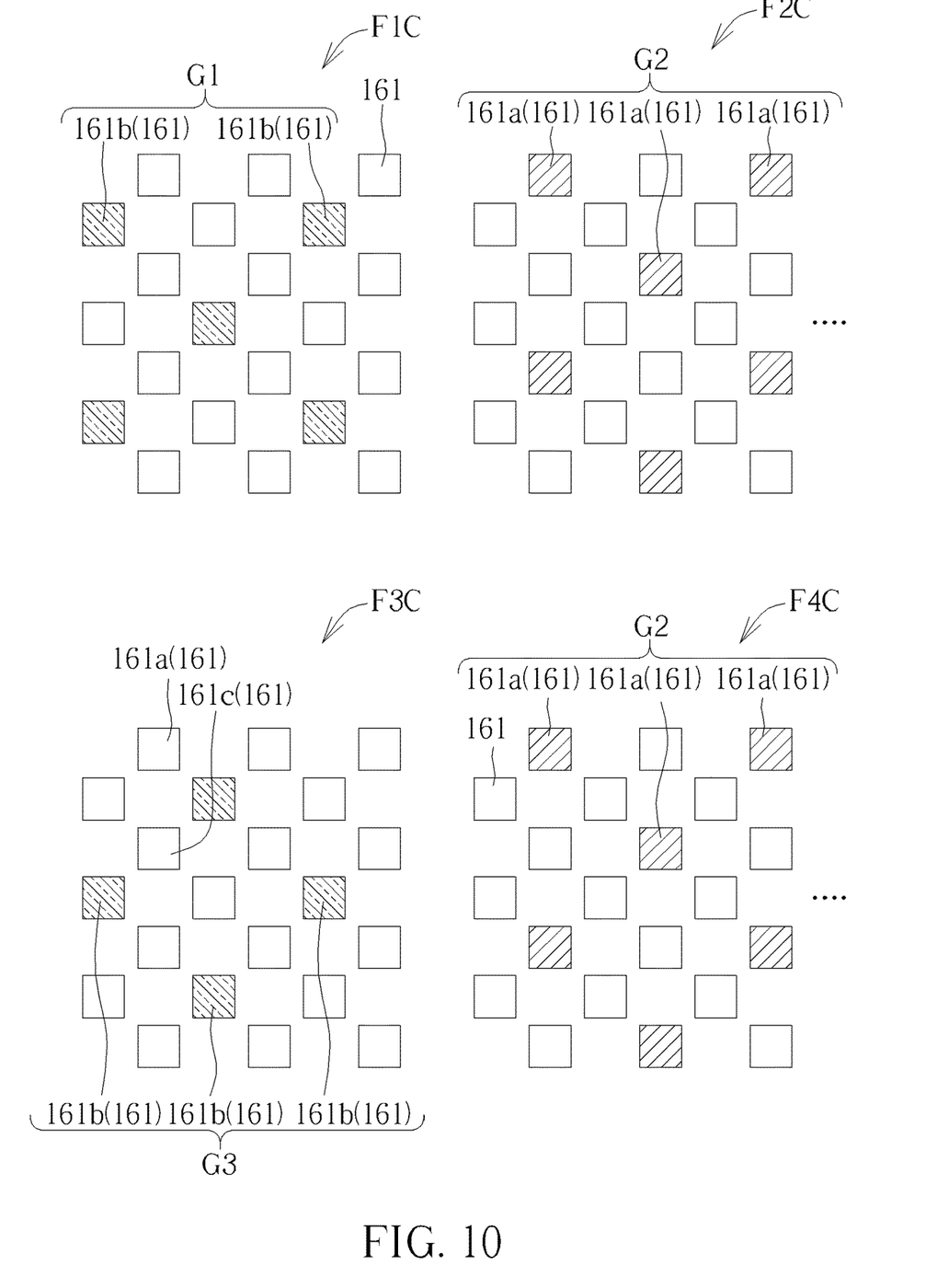
FIG. 10 schematically illustrates the sub-pixels turned on in different frame times according to some embodiments of the present disclosure.

FIG. 10 schematically illustrates the sub-pixels turned on in different frame times according to some embodiments of the present disclosure. In some embodiments, as compared with FIG. 9, the first group G1 of the sub-pixels 161 and the second group G2 of the sub-pixels 161 turned on sequentially may have different colors. Specifically, the first group G1 of the sub-pixels 161 having one color is turned on to display one frame F1C of one frame time, and the second group G2 of the sub-pixels 161 having another color is then turned on to display another frame F2C of another subsequent frame time while the remaining sub-pixels 161 are turned off. In some embodiment, after the frame F2C, a third group G3 of the sub-pixel 161 of the same color as the first group G1 maybe turned on to display another frame F3C of another subsequent frame time, and then the second group G2 of the sub-pixels 161 is turned on to display another frame F4C of another subsequent frame time, so the first group G1 of the sub-pixels 161, the second group G2 of the sub-pixels 161, the third group G3 of the sub-pixels 161 and the second group G2 of the sub-pixels 161 are turned on alternately. As an example, a part of the second sub-pixels 161b may be the first group G1 of the sub-pixels 161, other part of the second sub-pixels 161b may be the third group G3 of the sub-pixels 161, and all the first sub-pixels 161a may be the second group G2 of the sub-pixels 161. The second sub-pixels 161b in the first group G1 may be the same as the first group G1 shown in FIG. 9, and the second sub-pixels 161b in the third group G3 may be the same as the second group G2 in FIG. 9, so the patterns of the second sub-pixels in first group G1 and third group G3 will not be detailed redundantly. Through alternately turning on the first group G1, the second group G2, the third group G3 and the second group G2, the frames F1C, F2C, F3C, F4C can be alternately generated. It is noted that through alternately turning on the groups of the sub-pixels with different colors, more sensing units can be used to detect the biometric feature, and interference of reflected light from different sub-pixels 161b of different colors may still be reduced.

In some embodiments, the first group G1 of the sub-pixels 161 may be all the sub-pixels 161 having the same color (e.g. the second sub-pixels 161b), the second group G2 of the sub-pixels 161 may be all the sub-pixels 161 having another color (e.g. the first sub-pixels 161a), and the first group G1 and the second group G2 may be alternately turned on to display the frames F1C, F2C alternately.

Figure 11:
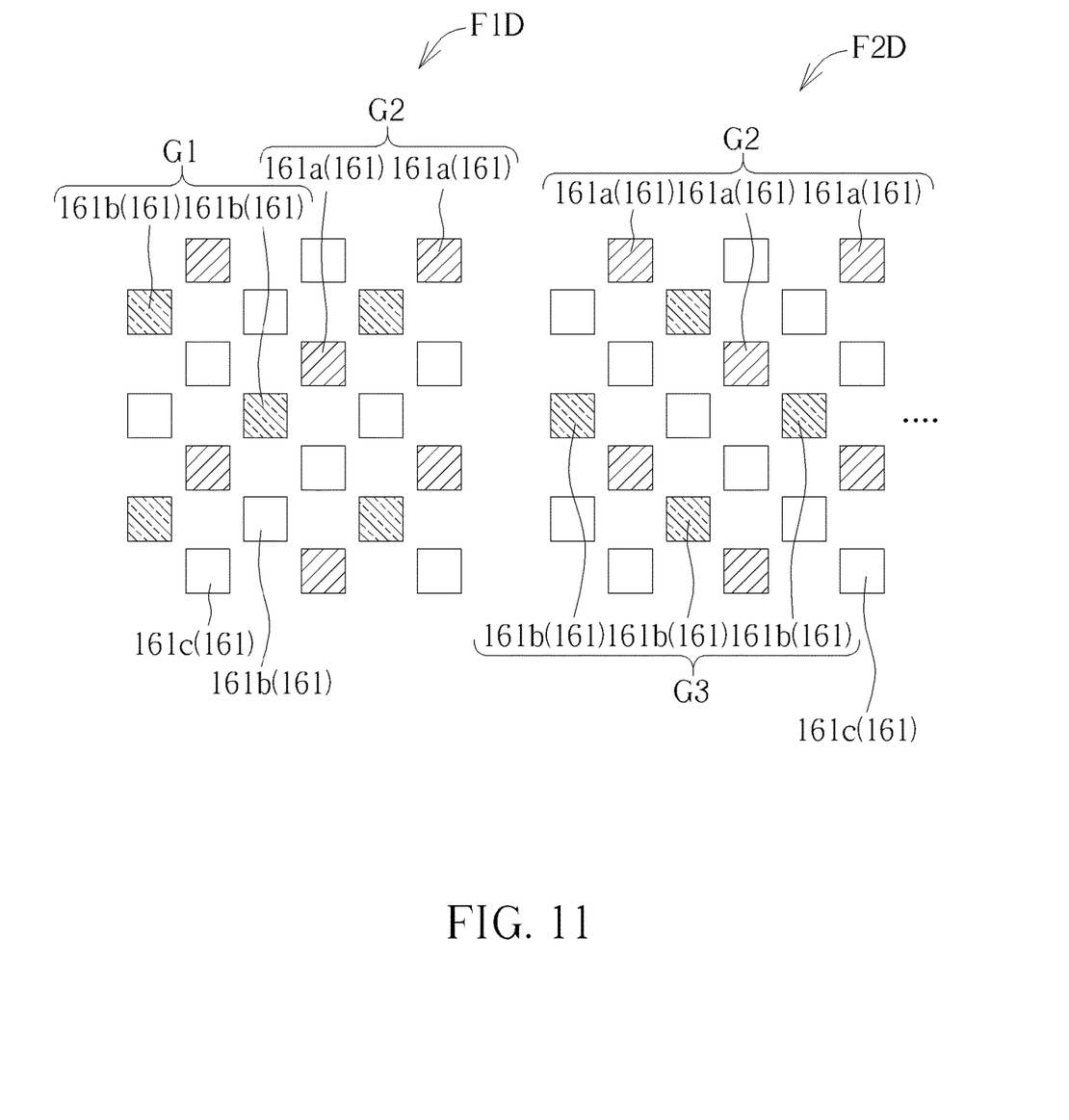
FIG. 11 schematically illustrates the sub-pixels turned on in different frame times according to some embodiments of the present disclosure.

FIG. 11 schematically illustrates the sub-pixels turned on in different frame times according to some embodiments of the present disclosure. In some embodiments, the first group G1 of the sub-pixels 161 and the second group G2 of the sub-pixels 161 that have different colors maybe turned on at a same time. Specifically, the first group G1 of the sub-pixels 161 having one color and the second group G2 of the sub-pixels 161 having another color are turned on to display one frame F1D of one frame time while the remaining sub-pixels 161 are turned off. In some embodiments, after the frame F1D, a third group G3 of the sub-pixel 161 having the same color as the first group G1 and the second group G2 may be turned on to display another frame F2D of another subsequent frame time, so the frames F1D, F2D may be displayed alternately. As an example, apart of the second sub-pixels 161b may be the first group G1 of the sub-pixels 161, and other part of the second sub-pixels 161b may be the third group G3 of the sub-pixels 161, and all the first sub-pixels 161a may be the second group G2 of the sub-pixels 161. The second sub-pixels 161b in the first group G1 may be the same as the first group G1 shown in FIG. 9, and the second sub-pixels 161b in the third group G3 may be the same as the second group G2 in FIG. 9, so the patterns of the second sub-pixels in first group G1 and third group G3 will not be detailed redundantly. For example, the first sub-pixels 161a have one of red and green, and the second sub-pixels 161b have the other one of red and green.

In some embodiments, after the frame F1D, the first group G1 of the sub-pixels 161 having one color and the second group G2 of the sub-pixels 161 having another color may be repeatedly turned on to display another frame F2D in next frame time. In some embodiments, all the second sub-pixels 161b may be the first group G1 of the sub-pixels 161.

As mentioned above, the display device can generate light pulse 3 to 120 times in the sensing time period, so the sensor element can receive light 3 to 120 times to accumulate enough signals and improve the S/N ratio and the sensitivity of the sensing units. For this reason, the sensor element can be integrated with the display element into the display region of the display device without reducing the area of each sub-pixel or reducing the resolution of the display device, thereby increasing screen-to-body ratio while providing biometric authentication.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device, comprising:
a controlling unit;
a display driver electrically connected to the controlling unit;
a sensor driver electrically connected to the controlling unit;
a display element electrically connected to the display driver; and
a sensor element electrically connected to the sensor driver;
wherein the display element comprises a plurality of sub-pixels, and the plurality of sub-pixels are composed of a first group of sub-pixels having a first color and a second group of sub-pixels having a second color different from the first color,
wherein the sensor element comprises a plurality of sensing units each respectively corresponding to one of the plurality of sub-pixels,
the sensor element is configured to sense a biometric feature in a sensing time period, the sensing time period comprises 3 to 120 frame times, wherein during each of the 3 to 120 frame times, at least one of the plurality of sub-pixels emits light, and at least one of the corresponding sensing units receives the light,
wherein during the sensing time period, the first group of sub-pixels is turned on one time in a first frame time of the 3 to 120 frame times by the display driver, while the second group of sub-pixels is turned off during the first frame time of the 3 to 120 frame times by the display driver, the second group of sub-pixels is turned on one time in a second frame time of the 3 to 120 frame times by the display driver, the second frame time is sequential with the first frame time in the sensing time period, while the first group of sub-pixels is turned off during the second frame time of the 3 to 120 frame times by the display driver,
the sensor element is capable of receiving light emitted from the display element 3 to 120 times in the sensing time period to form a plurality of readout signals, and the sensor driver accumulates a portion of the plurality of readout signals and then receives the portion of the plurality of readout signals from the sensor element more than one time in the sensing time period, a last time of the more than one time is in an ending portion of the sensing time period.

2. The display device according to claim 1, wherein the display element further comprises a third group of sub-pixels having the first color, the third group of sub-pixels is turned off during the first frame time and the second frame time, and the third group of sub-pixels is turned on one time in a third frame time of the 3 to 120 frame times by the display driver, the third frame time is sequential with the second frame time in the sensing time period, while the first group of sub-pixels and the second group of sub-pixels are turned off during the third frame time of the 3 to 120 frame times by the display driver.

3. The display device according to claim 1, wherein the display element further comprises a plurality of other sub-pixels, and the plurality of other sub-pixels are turned off during the first frame time and the second frame time.

4. The display device according to claim 1, wherein the first group of sub-pixels comprise a first sub-pixel, the second group of sub-pixels comprise a second sub-pixel, one of the plurality of sensing units is disposed between the first sub-pixel and the second sub-pixel, and a distance between the one of the plurality of sensing units and the first sub-pixel is less than a distance between the one of the plurality of sensing units and the second sub-pixel.

5. The display device according to claim 1, further comprising a liquid crystal layer disposed between the display element and the sensor element.

6. 1. A display device, comprising:
a controlling unit;
a display driver electrically connected to the controlling unit;
a sensor driver electrically connected to the controlling unit;
a display element electrically connected to the display driver; and
a sensor element electrically connected to the sensor driver, wherein the sensor element comprises a plurality of sensing units, and two of the sensing units have different areas; and
a plurality of display scan lines,
wherein the display element comprises a first group of sub-pixels having a first color and a second group of sub-pixels having a second color different from the first color, the first group of sub-pixels and the second group of sub-pixels have different areas, the sensor element is configured to sense a biometric feature in a sensing time period, the sensing time period comprises 3 to 120 frame times, a plurality of display scanning signals DS1-DSN are sequentially transmitted to the plurality of display scan lines one time in each of the 3 to 120 frame times by the display driver, respectively,
the sensor element is capable of receiving light emitted from the display element 3 to 120 times in the sensing time period to form a plurality of readout signals, the sensor driver accumulates a portion of the plurality of readout signals and then receives the portion of the plurality of readout signals from the sensor element more than one time in the sensing time period, and a last time of the more than one time is in an ending portion of the sensing time period.

\* \* \* \* \*